(12) United States Patent
Warren

(10) Patent No.: US 8,174,912 B2
(45) Date of Patent: May 8, 2012

(54) SYSTEMS AND METHODS FOR CIRCULAR BUFFERING CONTROL IN A MEMORY DEVICE

(75) Inventor: Robert W. Warren, Loveland, CO (US)

(73) Assignee: LSI Corporation, Milpitas, CA (US)

( * ) Notice: Subject to any disclaimer, the term of this patent is extended or adjusted under 35 U.S.C. 154(b) by 199 days.

(21) Appl. No.: 12/774,055

(22) Filed: May 5, 2010

(65) Prior Publication Data

US 2011/0058422 A1 Mar. 10, 2011

Related U.S. Application Data

(60) Provisional application No. 61/240,489, filed on Sep. 8, 2009.

(51) Int. Cl.
*G11C 7/00* (2006.01)

(52) U.S. Cl. .......... 365/189.16; 365/185.11; 365/189.05

(58) Field of Classification Search ............. 365/189.16, 365/185.11, 189.05
See application file for complete search history.

(56) References Cited

U.S. PATENT DOCUMENTS

| | | | |
|---|---|---|---|
| 6,700,809 B1 * | 3/2004 | Ng et al. ........................ | 365/49.1 |
| 6,993,600 B1 * | 1/2006 | Vo et al. ........................... | 710/33 |
| 7,106,633 B1 * | 9/2006 | Thompson et al. ...... | 365/189.02 |
| 7,127,549 B2 | 10/2006 | Sinclair | |
| 7,310,699 B2 | 12/2007 | Sinclair | |
| 7,382,637 B1 * | 6/2008 | Rathnavelu et al. ....... | 365/49.17 |
| 2005/0172067 A1 | 8/2005 | Sinclair | |
| 2007/0028040 A1 | 2/2007 | Sinclair | |
| 2009/0067303 A1 | 3/2009 | Poo | |
| 2009/0172280 A1 | 7/2009 | Trika et al. | |
| 2010/0177585 A1 * | 7/2010 | Rubinstein et al. ...... | 365/230.05 |

FOREIGN PATENT DOCUMENTS

KR 10/2009/0013394 2/2009

OTHER PUBLICATIONS

U.S. Appl. No. 12/473,454, filed May 28, 2009, Dreifus et al.
U.S. Appl. No. 12/691,797, filed Jan. 22, 2010, Warren et al.
U.S. Appl. No. 12/691,819, filed Jan. 22, 2010, Warren, et al.
U.S. Appl. No. 12/716,257, filed Mar. 2, 2010, Warren, Robert.
U.S. Appl. No. 12/716,259, filed Mar. 2, 2010, Warren, Robert.
U.S. Appl. No. 12/716,262, filed Mar. 2, 2010, Warren, Robert.
U.S. Appl. No. 12/716,265, filed Mar. 2, 2010, Warren, Robert.
U.S. Appl. No. 12/772,005, filed Apr. 3, 2010, Warren, et al.
U.S. Appl. No. 12/774,065, filed May 5, 2010, Warren, Robert.
U.S. Appl. No. 12/774,077, filed May 5, 2010, Warren, Robert.

* cited by examiner

*Primary Examiner* — Tuan T. Nguyen
(74) *Attorney, Agent, or Firm* — Hamilton, DeSanctis & Cha

(57) ABSTRACT

Various embodiments of the present invention provide systems, methods and circuits for memories and utilization thereof. As one example, memory devices are disclosed that include a plurality of non-volatile memory blocks, and a memory write circuit. The memory write circuit is operable to write subsets of the plurality of non-volatile memory blocks at locations identified by a pointer, and to update the pointer to implement a circular buffer in the plurality of non-volatile memory blocks. In some cases, the non-volatile memory blocks are flash memory blocks.

20 Claims, 11 Drawing Sheets

SYSTEMS AND METHODS FOR CIRCULAR BUFFERING CONTROL IN A MEMORY DEVICE

CROSS REFERENCE TO RELATED APPLICATIONS

The present application claims priority to (is a non-provisional of) U.S. Pat. App. No. 61/240,489, entitled "Circular Wear Leveling Approach to Extend Flash Memory Lifecycle", and filed Sep. 8, 2009 by Warren. The entirety of the aforementioned provisional patent application is incorporated herein by reference for all purposes.

BACKGROUND OF THE INVENTION

The present inventions are related to systems and methods for extending flash memory lifecycle, and more particularly to systems and methods for circular access to a memory device.

Flash memories have been used in a variety of devices where information stored by the device must be maintained even when power is lost to the device. A typical flash memory exhibits a number of cells that can be written a finite number of times after which the cells become unreliable. To increase the lifecycle of such flash memories, various wear leveling algorithms are employed that attempt to assure that an approximately equivalent number of writes are performed to each of the cells in the device. Such wear leveling algorithms level the wear in a device such that the cells expire at approximately the same point. Such wear leveling, however, can cause data movement within a flash memory device, thereby increasing the wear to some cells within the flash memory device.

Hence, for at least the aforementioned reason, there exists a need in the art for advanced systems and methods for extending the lifecycle of memory devices.

BRIEF SUMMARY OF THE INVENTION

The present inventions are related to systems and methods for extending flash memory lifecycle, and more particularly to systems and methods for circular access to a memory device.

Various embodiments of the present invention provide computer systems having a processor and a non-volatile memory. The processor is communicably coupled to the non-volatile memory. The non-volatile memory includes a number of non-volatile memory blocks, and a memory write circuit. The memory write circuit is operable to write subsets of the plurality of non-volatile memory blocks at locations identified by a pointer, and to update the pointer to implement a circular buffer in the plurality of non-volatile memory blocks.

In some instances of the aforementioned embodiments, the non-volatile memory further includes a circular buffer based wear leveling circuit. In some cases, the circular buffer based wear leveling circuit is operable to perform a wear leveling algorithm that includes indicating all of the plurality of non-volatile memory blocks as read only when a predefined percentage of the blocks have been written one time. In other cases, the circular buffer based wear leveling circuit is operable to perform a wear leveling algorithm that includes indicating a respective portion of the plurality of non-volatile memory blocks as read only once at least one block within the respective portion has been written a predefined number of times as indicated by a write use count value corresponding to the respective portion. In yet other cases, the circular buffer based wear leveling circuit is operable to perform a wear leveling algorithm that includes moving low use data to a respective portion of the plurality of non-volatile memory blocks having at least one block within the respective portion that has been written a predefined number of times as indicated by a write use count value corresponding to the respective portion and identifying the respective portion as read only.

Other embodiments of the present invention provide methods for wear leveling a memory device. The methods include providing a plurality of non-volatile memory blocks; writing series of subsets of the plurality of non-volatile memory blocks as a circular buffer; determining that a subsequent write will occur around the end of the circular buffer; and updating the circular buffer to invalidate respective subsets of the plurality of non-volatile memory blocks that include information that was superseded by writing the series of subsets. In some cases, the non-volatile memory blocks are flash memory blocks. In some instances of the aforementioned embodiments, invalidating respective subsets of the plurality of non-volatile memory blocks includes erasing the respective subsets of the plurality of non-volatile memory blocks. In one or more instances, updating the circular buffer to invalidate respective subsets of the plurality of non-volatile memory blocks that include information that was superseded by writing the series of subset includes identifying all of the plurality of non-volatile memory blocks as read only.

In various instances of the aforementioned embodiments, the methods further include updating a write use count value associated with a respective subset of the plurality of non-volatile memory blocks when the respective subset of the plurality of non-volatile memory blocks is written. In some such instances, the respective subset of the plurality of non-volatile memory blocks is a first subset of the plurality of non-volatile memory blocks, the write use count value is a first write use count value, and the methods further include: determining that the first write use count value indicates that the first subset of the plurality of non-volatile memory blocks is approaching an end of life; identifying a second subset of the plurality of non-volatile memory blocks and a corresponding second write use count value that is less than the first write use count value; moving a data set from the second subset of the plurality of non-volatile memory blocks to a subset of the first subset of the plurality of non-volatile memory blocks; and identifying the first subset of the plurality of non-volatile memory blocks as read only. In particular cases, the methods further include identifying the second subset of the plurality of non-volatile memory blocks as open for writing. In other instances, the methods further include erasing the second subset of the plurality of non-volatile memory blocks.

Yet other embodiments of the present invention provide memory devices that include a plurality of non-volatile memory blocks, and a memory write circuit. The memory write circuit is operable to write subsets of the plurality of non-volatile memory blocks at locations identified by a pointer, and to update the pointer to implement a circular buffer in the plurality of non-volatile memory blocks. In some cases, the non-volatile memory blocks are flash memory blocks. In some such cases, the memory write circuit is operable to determine an end of life of a respective subset of the plurality of non-volatile memory blocks, and to identify a respective subset of the plurality of non-volatile memory blocks as read only based on an end of life determination. In one particular case, the respective subset of the plurality of non-volatile memory blocks includes less than all of the subsets of the plurality of non-volatile memory blocks. In other cases, the respective subset of the plurality of non-volatile memory blocks includes all of the subsets of the plurality of non-volatile memory blocks.

In some instances of the aforementioned embodiments, the memory write circuit is operable to identify the plurality of non-volatile memory blocks as read only after a defined percentage of the plurality of non-volatile memory blocks have been written. In various instances, the memory device includes wear leveling control circuitry that is operable to level wear between subsets of the plurality of non-volatile memory blocks in the circular buffer. In some cases, the wear leveling control circuitry includes a write use counter that is operable to indicate a number of writes that have occurred in relation to respective subsets of the plurality of non-volatile memory blocks. In some such cases, the wear leveling control circuitry is operable to write a data set stored in a first subset of the plurality of non-volatile memory blocks exhibiting a first write use count to a second subset of the plurality of non-volatile memory blocks exhibiting a second write use count. In particular cases, the second write use count corresponds to an end of life of a memory block within the second subset of the plurality of non-volatile memory blocks and the wear leveling control circuitry is further operable to identify the second subset of the plurality of non-volatile memory blocks as read only.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
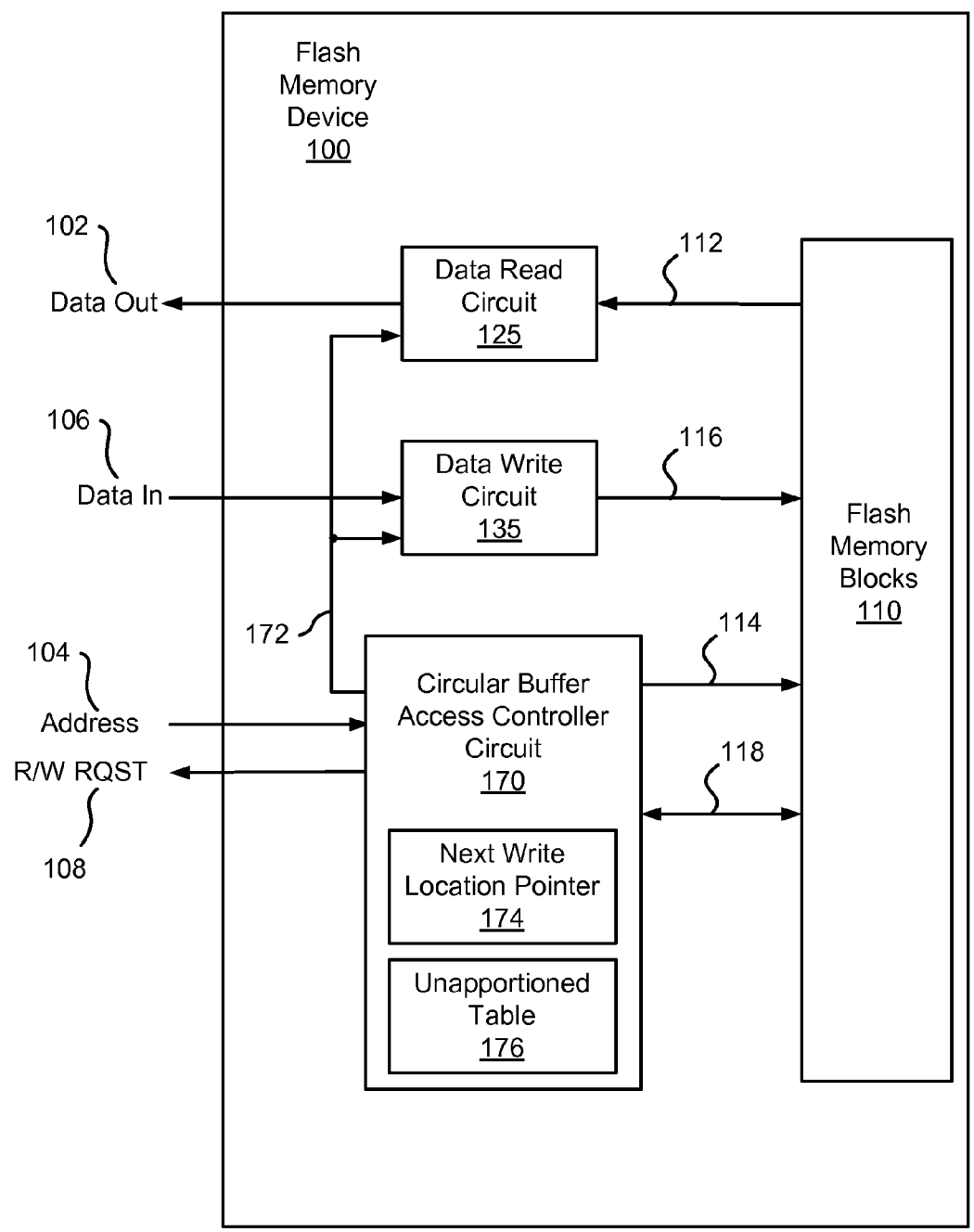
FIG. 1 shows a flash memory device including a circular buffering control in accordance with one or more embodiments of the present invention.

The present inventions are related to systems and methods for extending flash memory lifecycle, and more particularly to systems and methods for circular access to a memory device.

Various embodiments of the present invention replace existing complex wear leveling approaches that are designed to even wear across a device, with a circular buffering approach to memory allocation. As one advantage achievable by one or more embodiments of the present invention, such a circular buffering approach reduces the negative impact on localized memory locations that may result when a prior art wear leveling approach is utilized by capitalizing on the variance in the number of accesses to different types of data that may be maintained in a given memory. As a particular example, in some embodiments of the present invention only a single write to any given memory location has occurred up until the time that a next write pointer defining the progression around a circular buffer nears the end of the circular buffer.

At this point, all of the areas in the circular buffer that hold data that was modified and re-written to another location in the circular buffer are invalidated or de-allocated opening them to receive subsequent write data. The data that was either not accessed or only read is left in place. Subsequent writes are directed to the locations that were recently de-allocated and the process continues around the circular buffer another time. Over time, more and more of the data is not being accessed leaving less and less area for new writes to occur. At some point, the memory is identified as full at which time it may be replaced or marked as a read only memory and used for archival purposes.

Such a circular buffering approach may be particularly advantageous where the memory has a very limited lifecycle. As an example, where the memory cells of a flash memory device hold a relatively large number of bits per cell resulting in a usable life of ten (10) writes, a very large memory may be provided. In such a large memory, it is possible that a user will never traverse the entire memory space (i.e., re-start the circular buffer). In such a case, a prior art wear leveling algorithm may have used a substantial amount of the memory life attempting to wear level, whereas the circular buffer will have expended only one tenth of its memory life. At the other extreme, where the user goes nine times around the circular buffer, areas that hold static data may have been written as few as one time. In such a case, data that has been identified as static may be transferred from its prior location to areas that were previously written nine (9) times and marked as read only. This allows for a number of additional traversals of the circular buffer before the disk is finally marked as read only and replaced by another writable disk. Based upon the disclosure provided herein, one of ordinary skill in the art will recognize a variety of other advantages that may be achievable using one or more embodiments of the present invention.

Turning to FIG. 1, a flash memory device 100 including a circular buffering control is shown in accordance with one or more embodiments of the present invention. Flash memory device 100 is accessible via an interface that includes an address input bus 104, a read/write request signal set 108, a data in bus 106 and a data out bus 106. Flash memory device 100 includes a number of flash memory blocks 110. Such flash memory blocks may be comprised of any type of flash or other readable/writable non-volatile memory cells known in the art. In addition, flash memory device 100 includes a data read circuit 125, a data write circuit 135, and a circular buffer access controller circuit 170. Flash memory blocks 110 are accessible via an interface that includes an address signal bus 114, an access signal bus 118, a read output signal bus 112 and a write input signal bus 116.

Circular buffer access controller circuit 170 receives control signals from a host (not shown) requesting a read or a write from a particular address. The host may be any circuit or device capable of accessing a flash memory device or flash memory system. As one example, the host may be a microprocessor. Based upon the disclosure provided herein, one of ordinary skill in the art will recognize a variety of hosts that may be used in relation to different embodiments of the present invention. The address is received via address input bus 104, and the read or write access is indicated by read/write request signal set 108. Based upon the aforementioned inputs, circular buffer access controller circuit 170 controls operation of data read circuit 125 and data write circuit 135 by asserting/de-asserting one or more of control signals 172. Circular buffer access controller circuit 170 includes a buffer holding a next write location pointer 174 and an unapportioned table 176. Next write location pointer 174 identifies the next unapportioned area of the circular access defined in flash memory blocks 110. Unapportioned table 176 is a list of regions of flash memory blocks that do not hold current data.

When read/write request signal set 108 indicates a read operation, circular buffer access controller circuit 170 determines locations from which data is to be read using the data on address input bus 104, and provides an access address to flash memory blocks 110 via address signal bus 114. In addition, circular buffer access controller circuit 170 asserts one or more bits of access signal bus 118 indicating that a read is requested. When the requested data is available from flash memory blocks 110, one or more bits of access signal bus 118 are asserted by flash memory blocks 110 indicating data availability on read output signal bus 112. In turn, circular buffer access controller circuit 170 asserts one or more bits of control signals 172 indicating the availability of data to data read circuit 125.

Data read circuit 125 receives read data via read output signal bus 112 and formats the data for output via data out bus 102. In particular, data read circuit 125 receives one or more control signals 172 from circular buffer access controller circuit 170. Such control signals 172 indicate when data is available on read output signal bus 112, and a clock governing when the data received via read output signal bus 112 is to be written out to a requesting host (not shown) via data out bus 102. Data read circuit 125 receives the data available via read output signal bus 112 and provides the received data to a requesting host consistent with control signals 172.

When read/write request signal set 108 indicates a write operation, circular buffer access controller circuit 170 determines locations to which the data is to be written. To assure a circular distribution of data writes, the first address to be written is identified by next write location pointer 174. Circular buffer access controller circuit 170 further uses information from unapportioned table 176 to determine where the data will be written. Where, for example, the amount of data exceeds a contiguous unapportioned region pointed to by next write location pointer 174, the next available unapportioned region in flash memory blocks 110 when proceeding in a circle from next write location pointer 174 is selected to receive part of the write data. Where the data that is being written to flash memory blocks 110 is replacing data that was previously written to flash memory blocks 110, circular buffer access controller circuit 170 releases the previously used portion of flash memory blocks 110 by identifying the portion as unapportioned in unapportioned table 176. Thus, data may be read from one location in flash memory blocks 110, and where it is modified and written back to flash memory blocks 110, the data is written to the next unapportioned region(s) in flash memory blocks 110 when proceeding in a circle from next write location pointer 174. Further, the locations previously occupied by the modified write back data are listed as unapportioned allowing them to be used during later writes. Data write circuit 135 receives data via data in bus 106 and formats the data for writing to flash memory blocks 110 via write input signal bus 116. In particular, data write circuit 135 receives one or more control signals 172 from circular buffer access controller circuit 170. Such control signals 172 indicate when data is available on data in bus 106, and a clock governing when the data received via data in bus 106 is to be written out to flash memory blocks 110 via write data input signal bus 116. Data write circuit 135 receives the data available via data in bus 106 and writes the received data to flash memory blocks 110 consistent with control signals 172.

A summary of the operation of flash memory device 100 is provided in the following pseudocode:

```
If (Read Request)
{
    access the apportioned region in flash memory blocks 110 containing the data set
    indicated by the read address included in the read request; and
    provide the accessed data set as read data to a host via data out bus 102.
}
```

-continued

```
Else If (Write Request AND Data Set is Newly Introduced Data Set)
{
        create a newly apportioned region of flash memory blocks 110 by allocating a
region of flash memory blocks 110 that was previously unapportioned beginning at next
write location pointer 174;
        write the data set received as part of the write request to flash memory blocks 110
beginning at next write location pointer 174 and continuing to fill the newly apportioned
region;
        update unapportioned table 176 to reflect the allocation of previously
unapportioned regions; and
        update next write location pointer 174 to point at the next unapportioned location
in flash memory blocks 110 along the circular buffer.
}
Else If (Write Request AND Data Set is a Modified Previously Stored Data Set)
{
        de-allocate the apportioned region of flash memory blocks 110 where the
modified data set was previously stored to create a newly unapportioned region;
        update the unapportioned table to reflect the newly unapportioned region;
        create a newly apportioned region of flash memory blocks 110 by allocating a
region of flash memory blocks 110 that was previously unapportioned beginning at next
write location pointer 174;
        write the modified data set received as part of the write request to flash memory
blocks 110 beginning at next write location pointer 174 and continuing to fill the newly
apportioned region;
        update the unapportioned table to reflect the allocation of previously
unapportioned regions; and
        update next write location pointer 174 to point at the next unapportioned location
in flash memory blocks 110 along the circular buffer.
}
```

Figure 2:
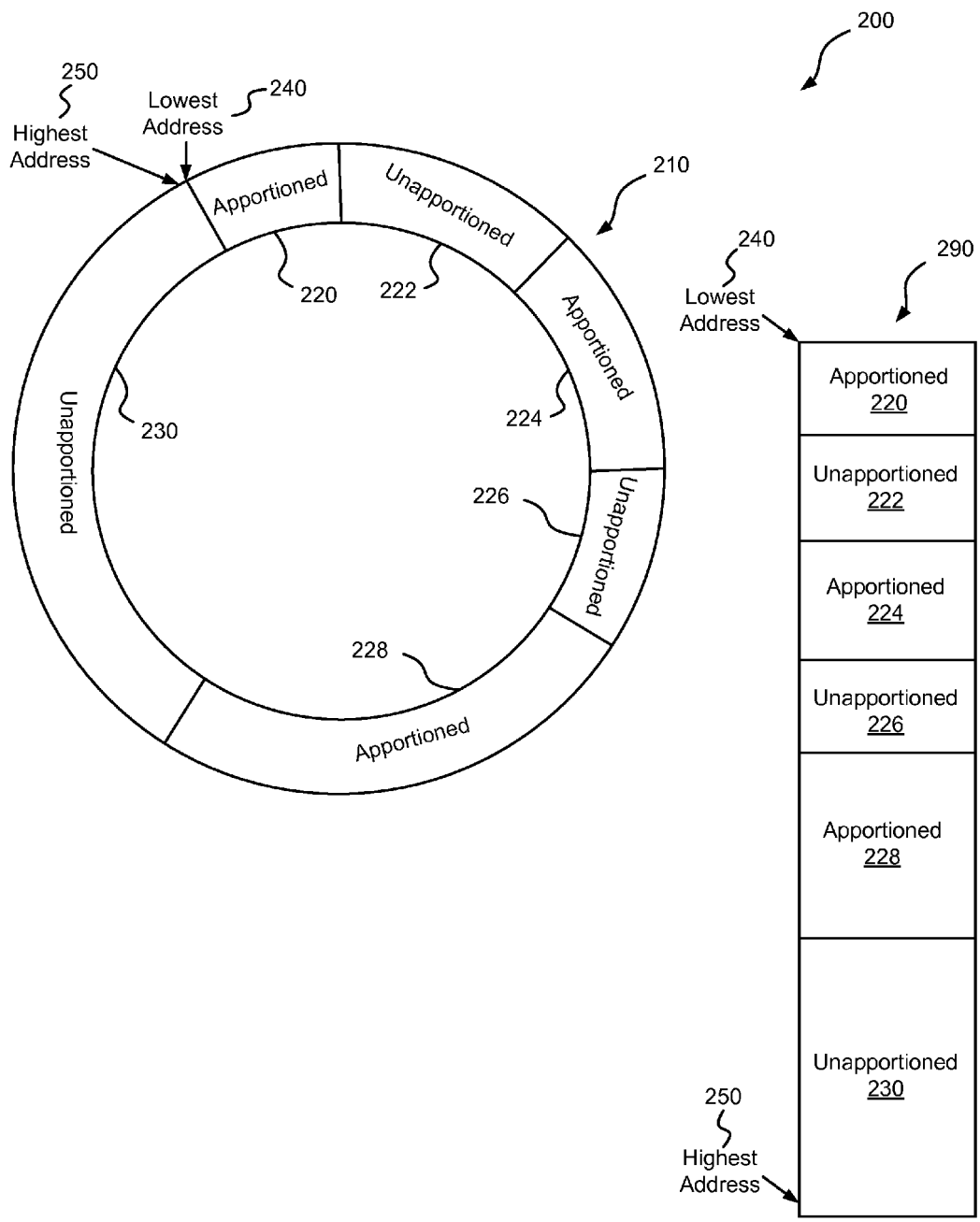
FIG. 2 graphically depicts an exemplary memory allocation where circular buffer control is used in accordance with various embodiments of the present invention.

Turning to FIG. 2, a graphical depiction 200 of an exemplary memory allocation where circular buffer control is implemented is shown in accordance with various embodiments of the present invention. Graphical depiction 200 includes a circular representation 210 of a linear memory space 290 corresponding to flash memory blocks 110. Circular representation 210 depicts a number of apportioned regions 220, 224, 228, and a number of unapportioned regions 222, 226, 230. As used herein, the term "apportioned" is used in its broadest sense to mean allocated to store information, and the term "unapportioned" is used in its broadest sense to mean unallocated or available for memory writes. Circular representation 210 corresponds to linear memory space 290 with a lowest address 240 corresponding to the lowest address in flash memory blocks 110, and a highest address 250 corresponding to the highest address in flash memory blocks 110. As shown, when flash memory blocks 110 are treated as a circular buffer, the next available address is flash memory blocks 110 after highest address 250 is lowest address 240.

Figure 3A:
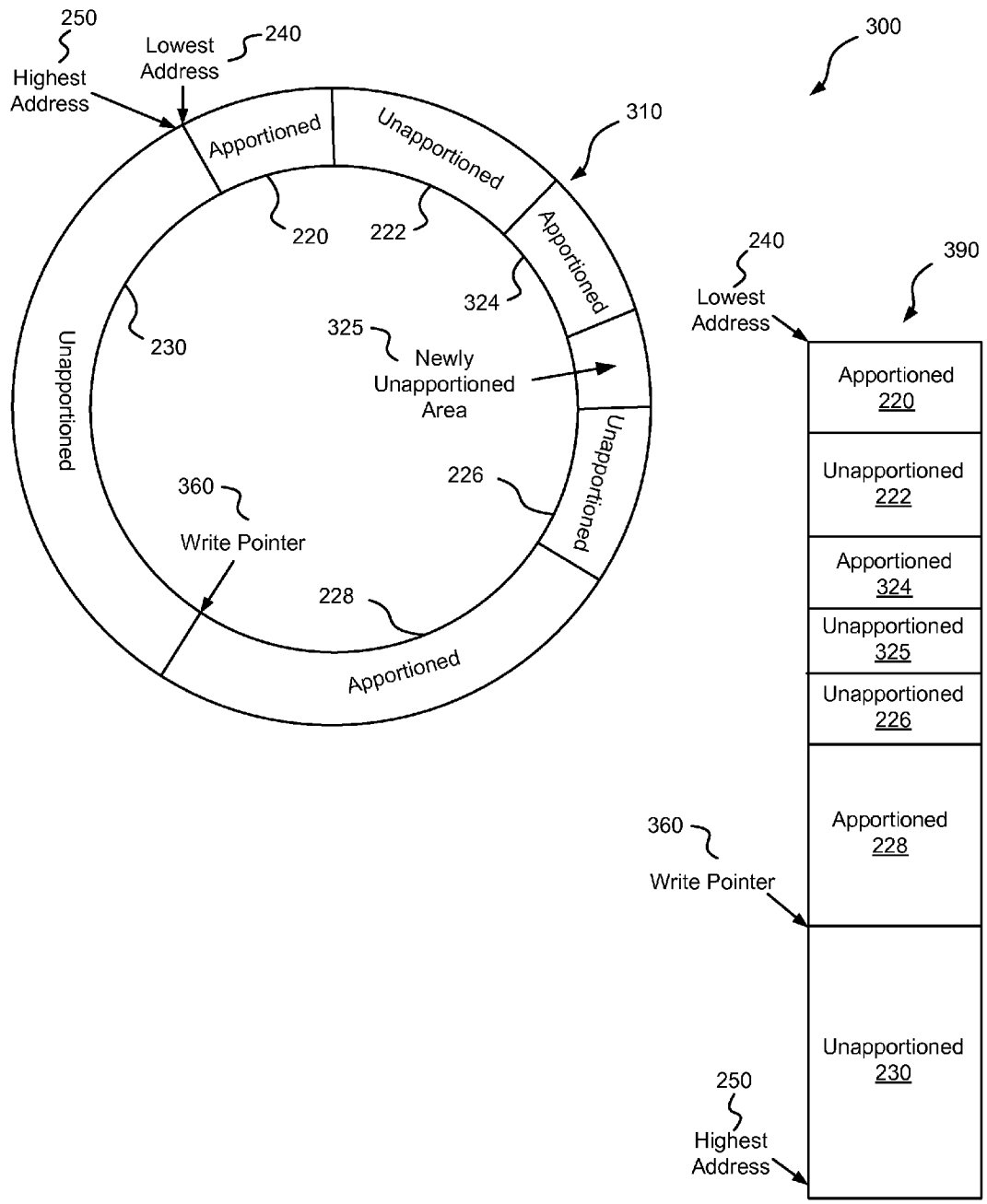
FIG. 3a graphically depicts the exemplary memory allocation of FIG. 2 expanded to depict the de-allocation of a memory region in preparation for a write to memory blocks under the direction of circular buffer control in accordance with various embodiments of the present invention.
Figure 3B:
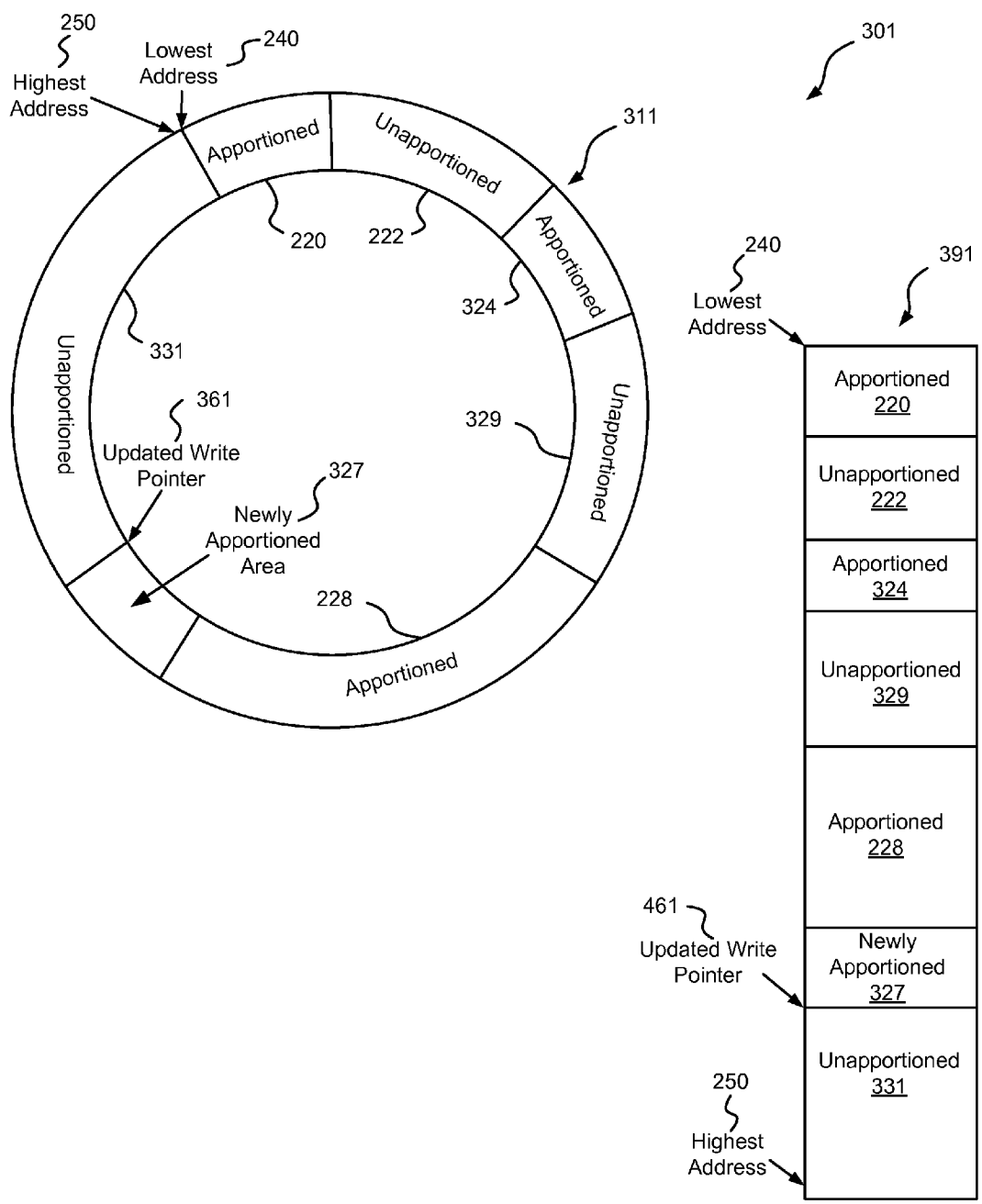
FIG. 3b graphically depicts the exemplary memory allocation of FIG. 2 expanded to depict the allocation of a memory region in preparation for a write to memory blocks under the direction of circular buffer control in accordance with various embodiments of the present invention.

Operation of the circular buffer of graphical depiction 200 is discussed in relation to a graphical depiction 300 of FIG. 3a and a graphical depiction 301 of FIG. 3b. Turning to FIG. 3a, graphical depiction 300 of the exemplary memory allocation of FIG. 2 is expanded to depict the de-allocation of a memory region in preparation for a write to memory blocks under the direction of circular buffer control in accordance with various embodiments of the present invention. In particular, graphical depiction 300 includes a circular representation 310 of a linear memory space 390 corresponding to flash memory blocks 110. Circular representation 310 depicts a number of apportioned regions 220, 324, 228, and a number of unapportioned regions 222, 226, 230 and 325. Circular representation 310 corresponds to linear memory space 390 with lowest address 240 corresponding to the lowest address in flash memory blocks 110, and highest address 250 corresponding to the highest address in flash memory blocks 110.

A write pointer 360 maintained as next write location pointer 174 in circular buffer access controller circuit 170. When data blocks that were previously maintained in newly unapportioned area 325 have been modified and are to be written back to flash memory blocks 110, the area where the data was previously written (i.e., newly unapportioned area 325) is de-allocated and unapportioned table 176 is updated by circular buffer access controller circuit 170 to identify the data blocks as unapportioned. At this juncture, flash memory blocks 110 are prepared to receive a write of the modified data set. As shown, newly unapportioned area 325 and apportioned area 324 were originally combined as apportioned area 224.

Turning to FIG. 3b, graphical depiction 301 of the exemplary memory allocation of FIG. 2 is expanded to depict the allocation of a memory region that receives the write data under the direction of circular buffer control in accordance with various embodiments of the present invention. In particular, graphical depiction 301 includes a circular representation 311 of a linear memory space 391 corresponding to flash memory blocks 110. Circular representation 311 depicts a number of apportioned regions 220, 324, 228 and 327, and a number of unapportioned regions 222, 329 and 335. Circular representation 311 corresponds to linear memory space 391 with lowest address 240 corresponding to the lowest address in flash memory blocks 110, and highest address 250 corresponding to the highest address in flash memory blocks 110.

Newly apportioned area 327 begins at write pointer 360 shown in graphical representation 300, and extends until sufficient unapportioned area has been identified to accept the volume of data to be written. The data to be written is written by data write circuit 135 beginning at the location indicated by write pointer 360 and continues under direction of circular buffer access controller circuit 170 until all of the data has been written to newly apportioned area 327. In this case, newly apportioned area 327 consumes a subset of unapportioned region 230, leaving another subset of unapportioned region 230 as unapportioned region 331. It should be noted that a newly apportioned region may include part or all of more than one unapportioned region where an exiting apportioned region intervenes along the circular buffer. An updated write pointer 361 is written to next write location pointer 174 in circular buffer access controller circuit 170. Updated write pointer 361 indicates the beginning location where a subsequent allocation for the next write of data will begin along the circular buffer.

As shown, newly unapportioned area 325 is combined with unapportioned area 226 to yield unapportioned area 329. Newly apportioned area 327 together with unapportioned area 331 were previously unapportioned area 230. It should be noted that it is possible to perform the apportionment followed by the write of the modified data to flash memory blocks before de-allocating the region previously occupied by the data set that was modified. In some cases where a high percentage of data blocks in flash memory device 100 are utilized, it may be necessary to perform the de-allocation first to assure sufficient available blocks to accept the data to be written. It should also be noted that where a data set that was not previously stored to flash memory blocks 110 is to be written to flash memory blocks 110, no de-allocation process is performed. Rather, a newly apportioned region is defined beginning at the write pointer and continuing until sufficient unapportioned areas are combined in a newly apportioned region to accept the new data set similar to that described in relation to FIG. 3b.

Figure 4:
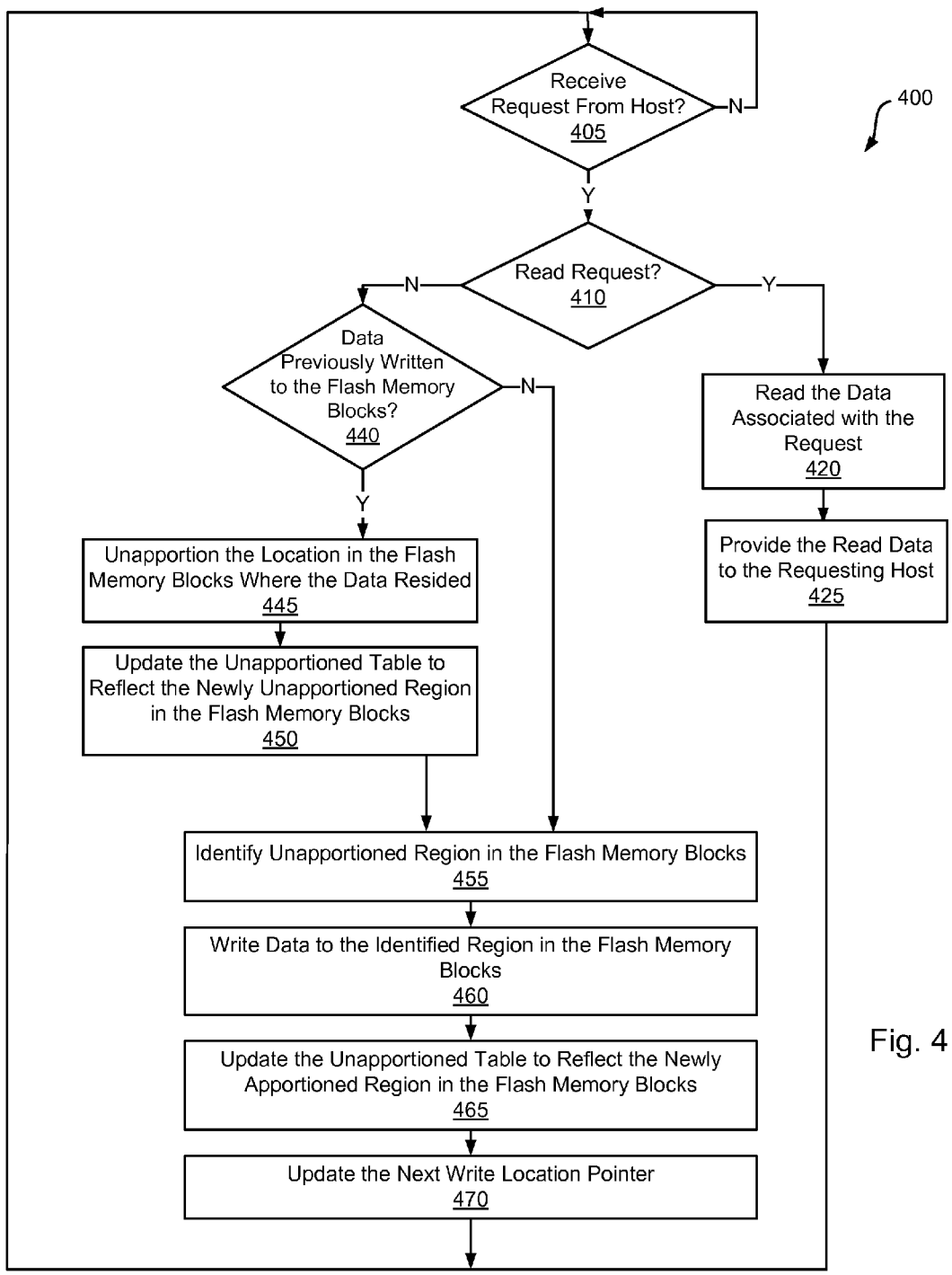
FIG. 4 is a flow diagram showing a method in accordance with various embodiments of the present invention for implementing a circular buffering algorithm in accordance with some embodiments of the present invention.

Turning to FIG. 4, a flow diagram 400 shows a method in accordance with various embodiments of the present invention for implementing a circular buffering algorithm in accordance with some embodiments of the present invention. Following flow diagram 400, it is determined whether a request has been received from a host (block 405). This may be determined, for example, by flash memory device 100 monitoring a read/write request signal set 108. In some cases, read/write request signal set 108 may include a signal indicating that flash memory device 100 has been selected for access. Based upon the disclosure provided herein, one of ordinary skill in the art will recognize a variety of mechanisms by which a flash memory device or flash memory system may determine that a request from a host is pending.

Where a request from the host is received (block 405), it is determined whether the request is associated with a read access or a write access (block 410). This may again be determined, for example, by flash memory device 100 monitoring a read/write request signal set 108. In some cases, read/write request signal set 108 may include a signal that is asserted at one assertion level for a read request and at another assertion level for a write request. Based upon the disclosure provided herein, one of ordinary skill in the art will recognize a variety of mechanisms by which a flash memory device or flash memory system may differentiate between a read request and a write request.

Where a read request is received (block 410), the data associated with the read request is accessed (block 420) and provided to the requesting host (block 425). This may include, for example, circular buffer access controller circuit 170 using the data on address input bus 104 to determine the locations within flash memory blocks 110 that are to be read, and providing an access address to flash memory blocks 110 via address signal bus 114. In addition, circular buffer access controller circuit 170 asserts one or more bits of access signal bus 118 indicating that a read is requested. When the requested data is available from flash memory blocks 110, one or more bits of access signal bus 118 are asserted by flash memory blocks 110 indicating data availability on read output signal bus 112. In turn, circular buffer access controller circuit 170 asserts one or more bits of control signals 172 indicating the availability of data to data read circuit 125.

Data read circuit 125 receives read data via read output signal bus 112 and formats the data for output via data out bus 102. In particular, data read circuit 125 receives one or more control signals 172 from circular buffer access controller circuit 170. Such control signals 172 indicate when data is available on read output signal bus 112, and a clock governing when the data received via read output signal bus 112 is to be written out to a requesting host (not shown) via data out bus 102. Data read circuit 125 receives the data available via read output signal bus 112 and provides the received data to a requesting host consistent with control signals 172. Based upon the disclosure provided herein, one of ordinary skill in the art will recognize a variety of approaches to satisfying a read request that may be used in relation to different embodiments of the present invention.

Alternatively, where a write request is received (block 410), it is determined whether the data associated with the write request was previously read, has been modified, and now is being written back (block 440). Where the data was not previously read, but rather is a newly introduced data set (block 440), an unapportioned region in the flash memory blocks is identified to receive the data (block 455). This identified unapportioned region begins at the location pointed to by a next write location pointer and continues until a region large enough to accept the newly written data is identified. In some cases, the identified unapportioned region is a contiguous region of flash memory blocks 110 comprising a subset of a previously identified unapportioned region. In other cases, the identified unapportioned region is non-contiguous region of flash memory blocks 110 comprising subsets of two or more previously identified unapportioned regions. The regions included in the newly identified unapportioned regions may be the next available unapportioned regions along the circular buffer as indicated in the unapportioned table.

The data set received as part of the write request is written to the identified unapportioned region (block 460). At this juncture, the identified unapportioned region has been allocated or apportioned to receive the new data set. This allocation or apportionment is identified by updating the unapportioned table to reflect the newly apportioned region in the flash memory blocks (block 465). Updating the unapportioned table includes identifying previously unapportioned regions of the flash memory blocks as apportioned. In addition, the next write location pointer is updated to point to the next unapportioned region of the flash memory blocks along the circular buffer (block 470). Once the highest address in the flash memory blocks has been written, the next potential address in the flash memory blocks is the lowest address thereby implementing a circular write approach.

Alternatively, where a write request is received (block 410) and it is determined that the data was previously read, modified and is now being written back (block 440), the region previously occupied by the data in the flash memory blocks is de-allocated or unapportioned (block 445). Such de-allocation may not include any modification of the cells in the memory region, or may include erasing cells in the memory region as a preparatory step to receiving another data set during a future write access. The de-allocated cells are identified in the unapportioned table (block 450). Updating the unapportioned table includes identifying previously apportioned regions of the flash memory blocks as unapportioned. Once the de-allocation processes are complete (blocks 445, 450), the processes allocating a region of memory and storing the received data set to the flash memory blocks is performed (blocks 455, 460, 465, 470).

Figure 5:
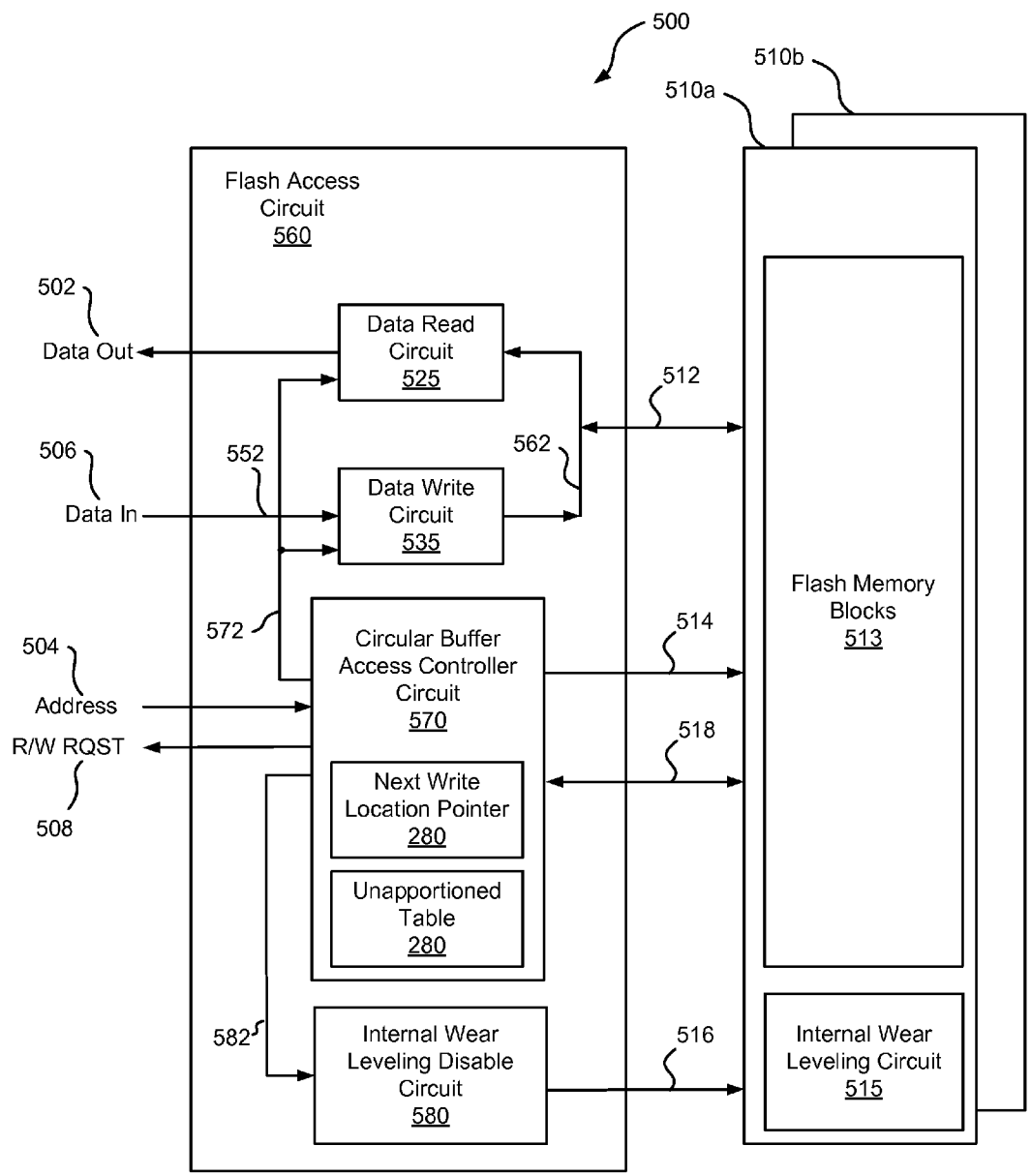
FIG. 5 shows a flash memory system including a flash memory device and a flash access circuit that implements circular buffer control in accordance with one or more embodiments of the present invention.

Turning to FIG. 5, a flash memory system 500 including one or more flash memory devices 510 and a flash access circuit 560 is shown that implements circular buffer control in accordance with one or more embodiments of the present invention. Of note, flash memory system 500 allows for flash access circuit 560 to control operation of one or more flash memory devices that may be available from one or more different sources. Flash memory devices 510 each include a number of flash memory blocks 513 and an internal wear leveling circuit 515 that implements a wear leveling algorithm to govern wear of flash memory blocks 513. Flash memory blocks 513 may be comprised of any type of flash or other readable/writable non-volatile memory cells known in the art. Internal wear leveling circuit 515 implements a known wear leveling algorithm that can be disabled by asserting a wear level enable signal 516. When disabled, the wear leveling implemented internal to flash memory devices 510 is turned off. The disabled wear leveling is replaced by a circular buffer access approach under control of flash access circuit 560.

Flash memory system 500 is accessible via an interface that includes an address input bus 504, a read/write request signal set 508, a data in bus 506 and a data out bus 506. Flash access circuit 560 includes a data read circuit 525, a data write circuit 535, and a circular buffer access controller circuit 570. Flash memory devices 510 is accessible to flash access circuit 560 via an interface that includes an address signal bus 514, an access signal bus 518, a bi-directional data bus 512 and a wear level enable signal 516.

Circular buffer access controller circuit 570 causes wear level enable signal 516 to be asserted whenever a circular buffering under external control is implemented. In particular, when circular buffering is implemented, circular buffer access controller circuit 570 asserts a disable signal 582 that is provided to an internal wear leveling disable determination circuit 580. Based at least in part on this, internal wear leveling disable determination circuit 580 asserts wear level enable signal 516 that disables internal wear leveling circuit 515 of flash memory devices 510.

Circular buffer access controller circuit 570 receives control signals from a host (not shown) requesting a read or a write from a particular address. The address is received via address input bus 504, and the read or write access is indicated by read/write request signal set 508. Based upon the aforementioned inputs, circular buffer access controller circuit 570 controls operation of data read circuit 525 and data write circuit 535 by asserting/de-asserting one or more of control signals 572. Circular buffer access controller circuit 570 includes a buffer holding a next write location pointer 574 and an unapportioned table 576. Next write location pointer 574 identifies the next unapportioned area of the circular access defined in flash memory devices 510. Unapportioned table 576 is a list of regions of flash memory blocks that do not hold current data.

When read/write request signal set 508 indicates a read operation, circular buffer access controller circuit 570 determines locations from which data is to be read using the data on address input bus 504, and provides an access address to flash memory devices 510 via address signal bus 514. In addition, circular buffer access controller circuit 570 asserts one or more bits of access signal bus 518 indicating that a read is requested. When the requested data is available from flash memory devices 510, one or more bits of access signal bus 518 are asserted by flash memory devices 510 indicating data availability on bi-directional data bus 512 that can be retrieved from an internal data bus 562. In turn, circular buffer access controller circuit 570 asserts one or more bits of control signals 572 indicating the availability of data to data read circuit 525.

Data read circuit 525 receives read data via internal data bus 562 and formats the data for output via data out bus 502. In particular, data read circuit 525 receives one or more control signals 572 from circular buffer access controller circuit 570. Such control signals 572 indicate when data is available on bi-directional data bus 512, and a clock governing when the data received via internal data bus 562 is to be written out to a requesting host (not shown) via data out bus 502. Data read circuit 525 receives the data available via internal data bus 562 and provides the received data to a requesting host consistent with control signals 572.

When read/write request signal set 508 indicates a write operation, circular buffer access controller circuit 570 determines locations to which the data is to be written. To assure a circular distribution of data writes, the first address to be written is identified by next write location pointer 574. Circular buffer access controller circuit 170 further uses information from unapportioned table 576 to determine where the data will be written. Where, for example, the amount of data exceeds a contiguous unapportioned region pointed to by next write location pointer 574, the next available unapportioned region in flash memory devices 510 when proceeding in a circle from next write location pointer 574 is selected to receive part of the write data. Where the data that is being written to flash memory devices 510 is replacing data that was previously written to flash memory blocks 510, circular buffer access controller circuit 570 releases the previously used portion of flash memory devices 510 by identifying the portion as unapportioned in unapportioned table 576. Thus, data may be read from one location in flash memory devices 510, and where it is modified and written back to flash memory devices 510, the data is written to the next unapportioned region(s) in flash memory devices 510 when proceeding in a circle from next write location pointer 574. Further, the locations previously occupied by the modified write back data are listed as unapportioned allowing them to be used during later writes. Data write circuit 535 receives data via data in bus 506 and formats the data for writing to flash memory devices 510 via write input signal bus 516. In particular, data write circuit 535 receives one or more control signals 572 from circular buffer access controller circuit 570. Such control signals 572 indicate when data is available on data in bus 506, and a clock governing when the data received via data in bus 506 is to be written out to flash memory devices 510 via internal data buys 562 and bi-directional data bus 512. Data write circuit 535 receives the data available via data in bus 506 and writes the received data to flash memory devices 510 consistent with control signals 572.

A summary of the operation of flash memory system 500 is provided in the following pseudocode:

```
If (Read Request)
{
        access the apportioned region in flash memory devices 510 containing the data set
indicated by the read address included in the read request; and
        provide the accessed data set as read data to a host via data out bus 502.
}
Else If (Write Request AND Data Set is Newly Introduced Data Set)
{
        create a newly apportioned region of flash memory device 110 by allocating a
region of flash memory devices 510 that was previously unapportioned beginning at next
write location pointer 574;
        write the data set received as part of the write request to flash memory devices
510 beginning at next write location pointer 574 and continuing to fill the newly
apportioned region;
        update unapportioned table 576 to reflect the allocation of previously
unapportioned regions; and
        update next write location pointer 574 to point at the next unapportioned location
in flash memory devices 510 along the circular buffer.
}
Else If (Write Request AND Data Set is a Modified Previously Stored Data Set)
{
        de-allocate the apportioned region of flash memory devices 510 where the
modified data set was previously stored to create a newly unapportioned region;
        update the unapportioned table to reflect the newly unapportioned region;
        create a newly apportioned region of flash memory devices 510 by allocating a
region of flash memory devices 510 that was previously unapportioned beginning at next
write location pointer 574;
        write the modified data set received as part of the write request to flash memory
devices 510 beginning at next write location pointer 574 and continuing to fill the newly
apportioned region;
        update the unapportioned table to reflect the allocation of previously
unapportioned regions; and
        update next write location pointer 574 to point at the next unapportioned location
in flash memory devices 510 along the circular buffer.
}
```

Figure 6:
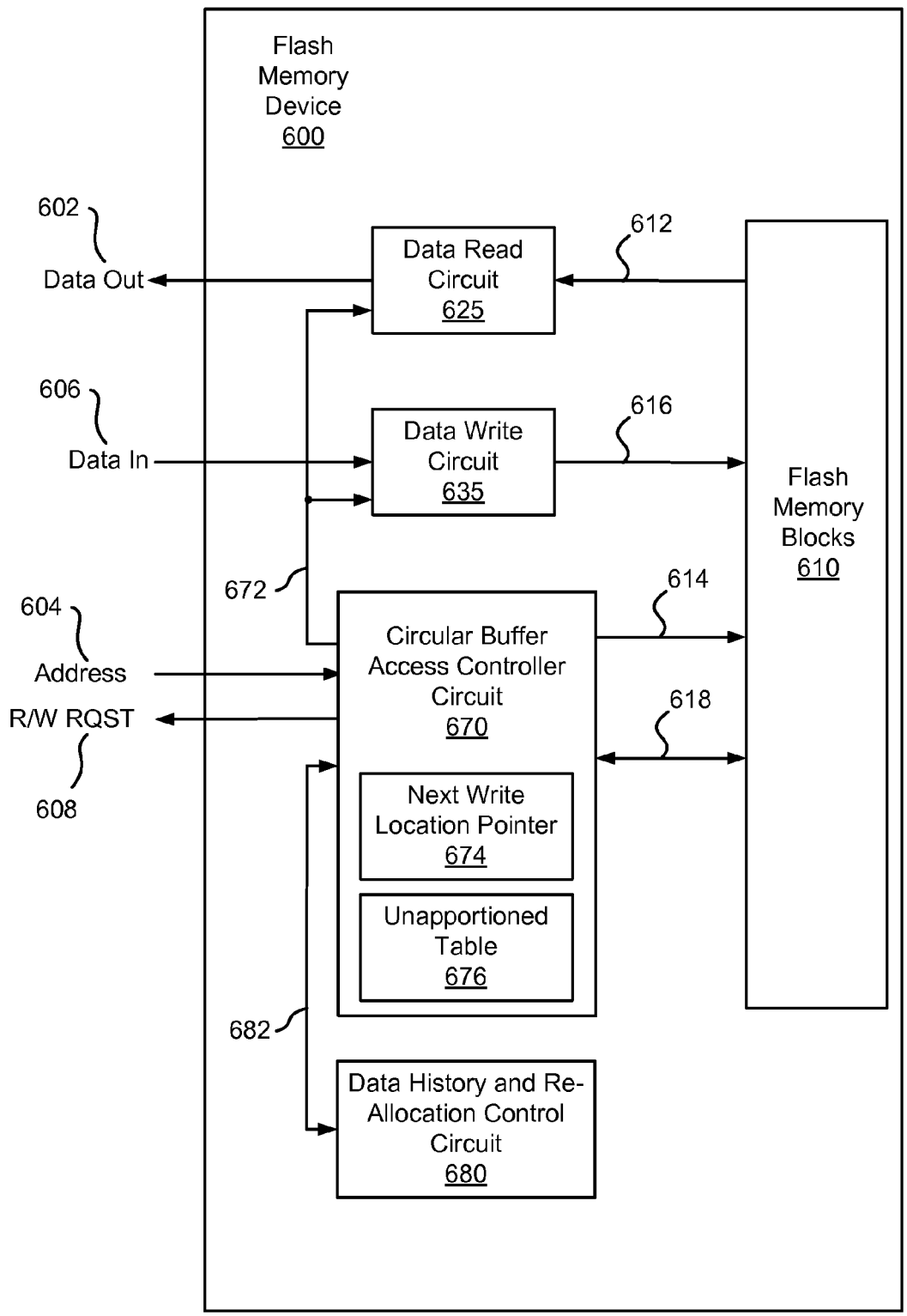
FIG. 6 shows another flash memory device including a circular buffering control and history based de-allocation in accordance with one or more embodiments of the present invention.

Turning to FIG. 6, another flash memory device 600 including a circular buffering control and history based de-allocation is shown in accordance with one or more embodiments of the present invention. Flash memory device 600 is accessible via an interface that includes an address input bus 604, a read/write request signal set 608, a data in bus 606 and a data out bus 606. Flash memory device 600 includes a number of flash memory blocks 610. Such flash memory blocks may be comprised of any type of flash or other readable/writable non-volatile memory cells known in the art. In addition, flash memory device 600 includes a data read circuit 625, a data write circuit 635, and a circular buffer access controller circuit 670. Flash memory blocks 610 are accessible via an interface that includes an address signal bus 614, an access signal bus 618, a read output signal bus 612 and a write input signal bus 616.

Circular buffer access controller circuit 670 receives control signals from a host (not shown) requesting a read or a write from a particular address. The host may be any circuit or device capable of accessing a flash memory device or flash memory system. As one example, the host may be a microprocessor. Based upon the disclosure provided herein, one of ordinary skill in the art will recognize a variety of hosts that may be used in relation to different embodiments of the present invention. The address is received via address input bus 604, and the read or write access is indicated by read/write request signal set 608. Based upon the aforementioned inputs, circular buffer access controller circuit 670 controls operation of data read circuit 625 and data write circuit 635 by asserting/de-asserting one or more of control signals 672. Circular buffer access controller circuit 670 includes a buffer holding a next write location pointer 674 and an unapportioned table 676. Next write location pointer 674 identifies the next unapportioned area of the circular access defined in flash memory blocks 610. Unapportioned table 676 is a list of regions of flash memory blocks that do not hold current data.

When read/write request signal set 608 indicates a read operation, circular buffer access controller circuit 670 determines locations from which data is to be read using the data on address input bus 604, and provides an access address to flash memory blocks 610 via address signal bus 614. In addition, circular buffer access controller circuit 670 asserts one or more bits of access signal bus 618 indicating that a read is requested. When the requested data is available from flash memory blocks 610, one or more bits of access signal bus 618 are asserted by flash memory blocks 610 indicating data availability on read output signal bus 612. In turn, circular buffer access controller circuit 670 asserts one or more bits of control signals 672 indicating the availability of data to data read circuit 625.

Data read circuit 625 receives read data via read output signal bus 612 and formats the data for output via data out bus 602. In particular, data read circuit 625 receives one or more control signals 672 from circular buffer access controller circuit 670. Such control signals 672 indicate when data is available on read output signal bus 612, and a clock governing when the data received via read output signal bus 612 is to be written out to a requesting host (not shown) via data out bus 602. Data read circuit 625 receives the data available via read output signal bus 612 and provides the received data to a requesting host consistent with control signals 672.

When read/write request signal set 108 indicates a write operation, circular buffer access controller circuit 670 determines locations to which the data is to be written. To assure a circular distribution of data writes, the first address to be written is identified by next write location pointer 674. Circular buffer access controller circuit 670 further uses information from unapportioned table 676 to determine where the data will be written. Where, for example, the amount of data exceeds a contiguous unapportioned region pointed to by next write location pointer 674, the next available unapportioned region in flash memory blocks 610 when proceeding in a circle from next write location pointer 674 is selected to receive part of the write data. Where the data that is being written to flash memory blocks 610 is replacing data that was previously written to flash memory blocks 610, circular buffer access controller circuit 670 identifies the portion as unapportioned in unapportioned table 676 without changing the state of the unapportioned memory area. Thus, data may be read from one location in flash memory blocks 610, and where it is modified and written back to flash memory blocks 610, the data is written to the next unapportioned region(s) in flash memory blocks 610 when proceeding in a circle from next write location pointer 674. Further, the locations previously occupied by the modified write back data are listed as unapportioned allowing them to be utilized on a subsequent pass around the circular buffer as discussed below in relation to a data history and re-allocation control circuit 680. Data write circuit 635 receives data via data in bus 606 and formats the data for writing to flash memory blocks 610 via write input signal bus 616. In particular, data write circuit 635 receives one or more control signals 672 from circular buffer access controller circuit 670. Such control signals 672 indicate when data is available on data in bus 606, and a clock governing when the data received via data in bus 606 is to be written out to flash memory blocks 610 via write data input signal bus 616. Data write circuit 635 receives the data available via data in bus 606 and writes the received data to flash memory blocks 610 consistent with control signals 672.

Data history and re-allocation control circuit 680 receives an end of buffer signal that is part of a signal set 682 from circular buffer access controller circuit 670. The end of buffer signal is asserted when next write location pointer 674 is within a defined number of blocks of the highest address in flash memory blocks 610. When the end of buffer signal is received, data history and re-allocation control circuit 680 prepares the circular buffer defined in flash memory blocks 610 for a subsequent pass around the circle.

In particular, data history and re-allocation control circuit 680 erases any unapportioned regions between the lowest address in flash memory blocks and next write location pointer 674 that are identified in unapportioned table 676 in preparation for receiving new write data in the locations. These erased unapportioned regions held data that was once valid, but that has been superseded as the data was retrieved there from, modified and re-written to a newly apportioned area. In addition, data history and re-allocation control circuit 680 increments a write use counter associated with each of the erased regions. The write use counter indicates how many times a particular region in flash memory blocks 610 has been written.

Where the write use counter for a given region indicates that the expected number of writes for a given region is close to its expected lifecycle, data history and re-allocation control circuit 680 moves data (i.e., low use or static data) from a region of flash memory blocks that has been written a low number of times into the region that has experienced substantial write activity, and marks the region as read only. The read only region is then identified as apportioned in unapportioned table 676. The region from which the low use or static data was moved is then erased, and identified as an unapportioned region in unapportioned table 676. This extends the lifecycle of flash memory blocks by moving low use or static data to a region approaching the end of its life, and opening the substantially unused region previously occupied by the low use or static data for additional write activity. In this way, wear leveling can be implemented using a circular buffer where the wear leveling adaptively accounts for the different use characteristics of different data sets in flash memory blocks 610. This is in contrast to other wear leveling approaches that treat all data types uniformly.

In addition, data history and re-allocation control circuit 680 determines whether sufficient writable regions remain in flash memory blocks 610 to allow for reasonable operation as a writable memory. Where insufficient writable regions remain, the entirety of flash memory blocks 610 may be identified as read only. In such a case, the ability of flash memory blocks to retain data for read purposes extending a considerable period into the future is maintained. This allows a user to replace the memory without any memory loss, and/or to add another writable memory to the memory space and maintain the current memory as an archive of static data.

Figure 7A:
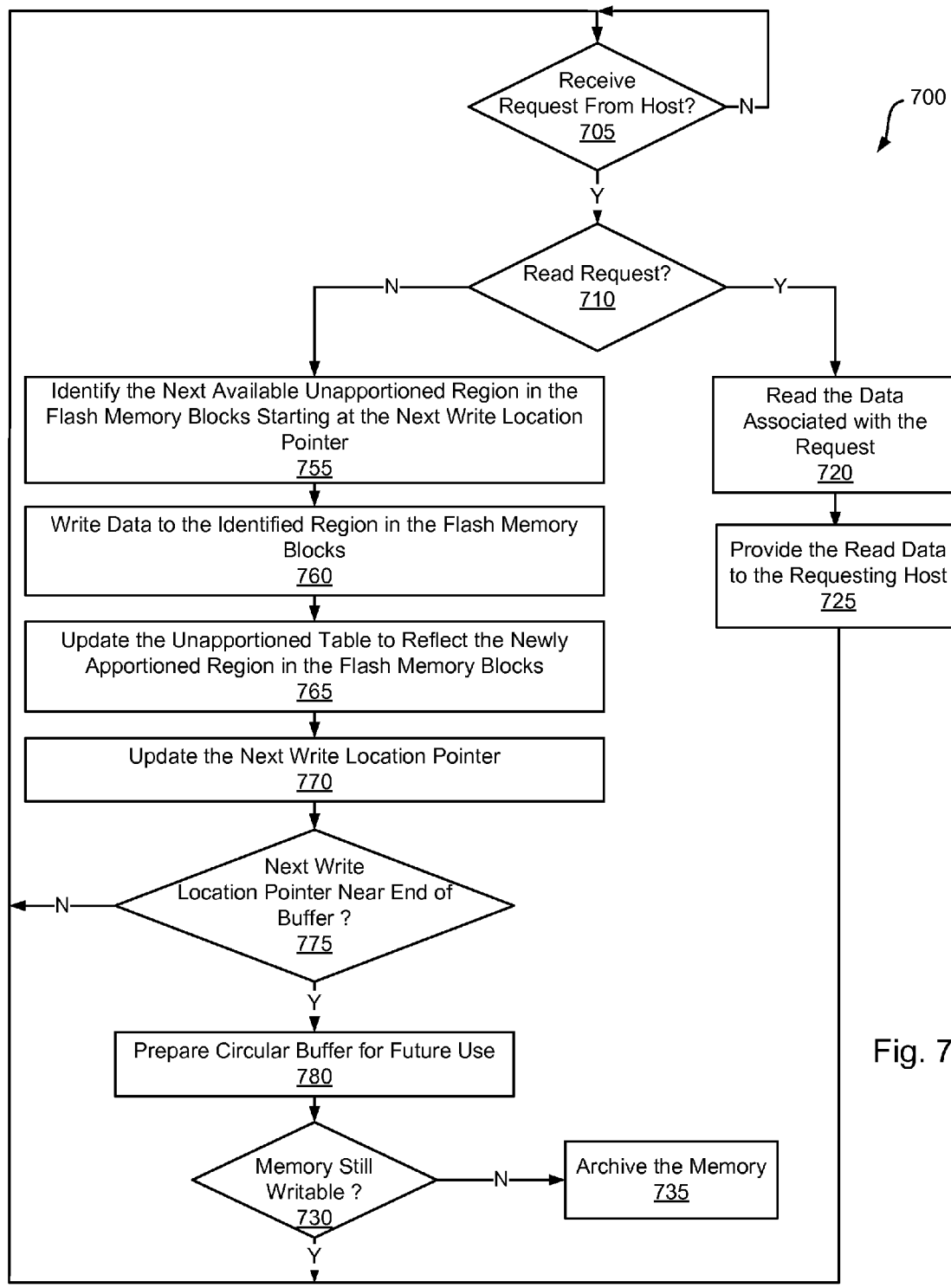
FIG. 7a is a flow diagram showing a method in accordance with some embodiments of the present invention for implementing a circular buffering algorithm in accordance with some embodiments of the present invention.
Figure 7B:
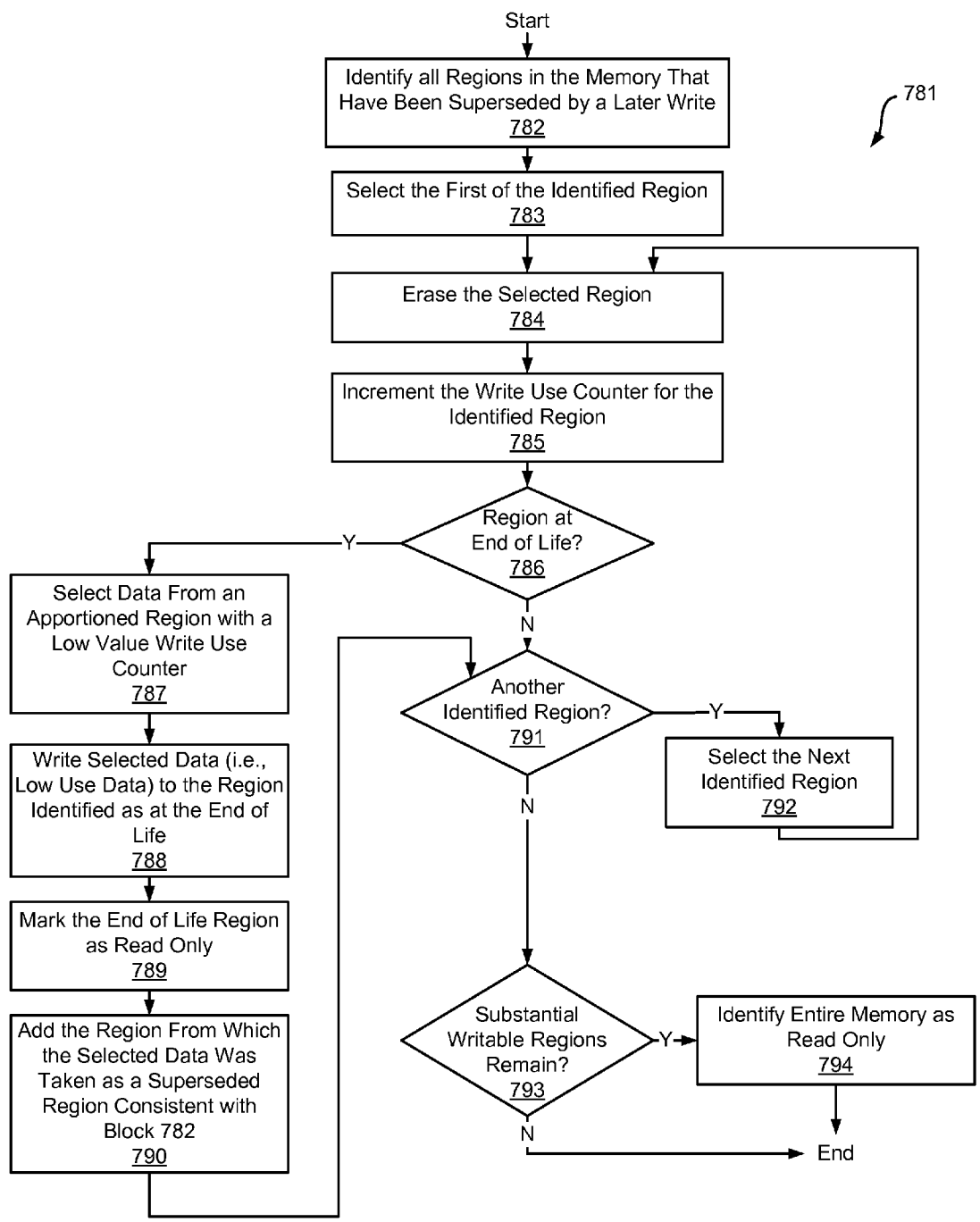
FIG. 7b is a flow diagram showing a method in accordance with various embodiments of the present invention for performing wear leveling on a circular buffered flash memory device in accordance with one or more embodiments of the present invention.

FIG. 7b is a flow diagram 700 shows a method in accordance with some embodiments of the present invention for implementing a circular buffering algorithm in accordance with some embodiments of the present invention. Following flow diagram 700, it is determined whether a request has been received from a host (block 705). This may be determined, for example, by flash memory device 600 monitoring a read/write request signal set 608. In some cases, read/write request signal set 608 may include a signal indicating that flash memory device 600 has been selected for access. Based upon the disclosure provided herein, one of ordinary skill in the art will recognize a variety of mechanisms by which a flash memory device or flash memory system may determine that a request from a host is pending.

Where a request from the host is received (block 705), it is determined whether the request is associated with a read access or a write access (block 710). This may again be determined, for example, by flash memory device 600 monitoring a read/write request signal set 608. In some cases, read/write request signal set 608 may include a signal that is asserted at one assertion level for a read request and at another assertion level for a write request. Based upon the disclosure provided herein, one of ordinary skill in the art will recognize a variety of mechanisms by which a flash memory device or flash memory system may differentiate between a read request and a write request.

Where a read request is received (block 710), the data associated with the read request is accessed (block 720) and provided to the requesting host (block 725). This may include, for example, circular buffer access controller circuit 670 using the data on address input bus 604 to determine the locations within flash memory blocks 610 that are to be read, and providing an access address to flash memory blocks 610 via address signal bus 614. In addition, circular buffer access controller circuit 670 asserts one or more bits of access signal bus 618 indicating that a read is requested. When the requested data is available from flash memory blocks 610, one or more bits of access signal bus 618 are asserted by flash memory blocks 610 indicating data availability on read output signal bus 612. In turn, circular buffer access controller circuit 670 asserts one or more bits of control signals 672 indicating the availability of data to data read circuit 625. Data read circuit 625 receives read data via read output signal bus 612 and formats the data for output via data out bus 602. In particular, data read circuit 625 receives one or more control signals 672 from circular buffer access controller circuit 670. Such control signals 672 indicate when data is available on read output signal bus 612, and a clock governing when the data received via read output signal bus 612 is to be written out to a requesting host (not shown) via data out bus 602. Data read circuit 625 receives the data available via read output signal bus 612 and provides the received data to a requesting host consistent with control signals 672. Based upon the disclosure provided herein, one of ordinary skill in the art will recognize a variety of approaches to satisfying a read request that may be used in relation to different embodiments of the present invention.

Alternatively, where a write request is received (block 710), the next available unapportioned region in the flash memory blocks starting at the next write location pointer is identified to receive the data (block 755), and the write data is written to the identified region in the flash memory blocks. The unapportioned table is updated to reflect the newly apportioned region in the flash memory blocks (block 765), and the next write location pointer is updated to reflect the next location in the circular buffer that is to be written (block 770). Updating the unapportioned table includes determining whether the data associated with the write request was previously read, has been modified, and now is being written back. Where such is the case, the unapportioned table is updated to identify the location where the data was previously maintained as unapportioned and identifying the location where the modified data is written as apportioned. Where the data was not previously maintained in the memory, updating the unapportioned table includes identifying the location where the data is written as apportioned.

It is then determined whether the next write location pointer is near the end of the circular buffer (block 775). As one of many examples, such a determination may include determining whether the next write location pointer is within a defined percentage of the end of the buffer. Where the next write location pointer is not near the end of the buffer (block 775), the process of reading and writing the buffer is continued. Alternatively, where the next write location pointer is near the end of the buffer (block 775), the circular buffer is prepared for additional use including a subsequent traversal of writes around the circular buffer.

Turning to FIG. 7b, a flow diagram 781 shows an exemplary process of preparing the circular buffer for future use that may be used in place of block 780. Of note, the process performs wear leveling on a circular buffered flash memory device in accordance with one or more embodiments of the present invention. Following flow diagram 781, the unapportioned table is used to identify all regions that have been superseded by a later write (block 782). A first one of the identified regions is selected (block 783), the region is erased (block 784), and a write use counter associated with the region is incremented (block 785). The write use counter indicates how many times the particular memory region has been written, and serves as an indicator of how much of the useful life of the memory remains.

Based on the write use counter, it is determined whether the memory region is approaching the end of its writable life (block 786). Thus, as just one of many examples, where the memory is expected to support one hundred writes over its lifecycle, the region may be considered to be approaching the end of its usable life when the write use counter is at ninety-nine (99). Where it is determined that the region is at the end of its life (block 786), data from an apportioned region exhibiting a low number of writes (i.e., associated with a write use count of low value) is selected (block 787). This low use data is written to the region that is near the end of its usable life (block 788), and the region identified as being at the end of life is identified as apportioned and read only (block 789). The region from which the low use data was moved is then identified as a superseded region and will be processed similar to those regions identified in block 782 (block 790).

Where either it is determined that the region is not at the end of its life (block 786), or the region at the end of its lifecycle has been identified as read only (blocks 789), it is determined if another identified region (i.e., a region identified in block 782 or block 790) remains to be processed (block 791). Where another region remains to be processed (block 791), the next identified region is selected (block 792), and the processes of blocks 784 through 791 are repeated for the next identified blocks. Where no additional regions remain to be processed (block 791), it is determined whether the memory still includes a sufficient number of writable regions to allow for reasonable use of the memory as a readable and writable memory (block 793). This may include, but is not limited to, determining whether a predefined threshold percentage of all memory blocks remain both writable and readable. Where a sufficient number of readable and writable blocks do not remain (block 793), the entire memory is identified as read only (block 794).

Returning to the discussion of FIG. 7a, it is determined whether the memory is still writable (e.g., includes a reasonable percentage of blocks that remain both writable and readable) as indicated by the preceding processes (block 730). Where the memory is still writable (block 730), the process of reading and writing the buffer is continued. Alternatively, where the memory is no longer writable (block 730), it is retained for archive (i.e., read only) purposes (block 735).

Figure 7C:
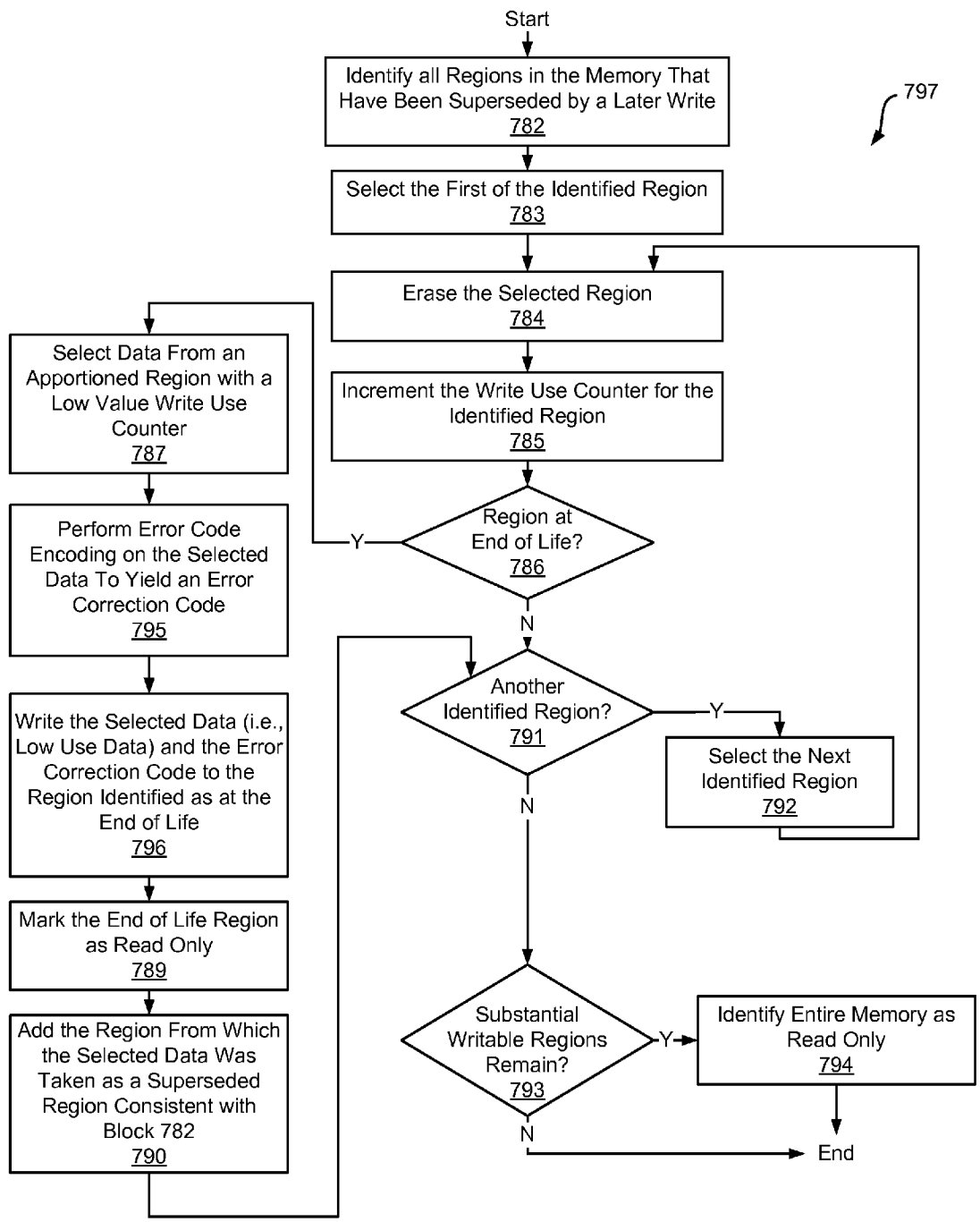
FIG. 7c is a flow diagram showing another method in accordance with various embodiments of the present invention for performing wear leveling on a circular buffered flash memory device in accordance with one or more embodiments of the present invention.

Turning to FIG. 7c, a flow diagram 796 shows another exemplary process of preparing the circular buffer for future use that may be used in place of block 780. Of note, the process performs wear leveling on a circular buffered flash memory device in accordance with one or more embodiments of the present invention. Flow diagram 797 is substantially the same as flow diagram 781 of FIG. 7b, except that data written to a region that has reached its end of life is enhanced with an error correction code giving further insurance that the data may be accurately retrieved from the read only location at some point in the future. Doing this involves performing error code encoding on the selected data to yield an error correction code (block 795), and writing the generated error correction code and low use data to the end of life region (block 796). Of note, block 796 is a modified version of block 788 of FIG. 7b. The error code encoding may be any process or algorithm known in the art to create an error correction code. Thus, the error code encoding may be, but is not limited to, a Reed Solomon encoding or a parity checksum encoding. Examples of error encoding circuits and error encoding processes that may be used in relation to embodiments of the present invention are discussed in U.S. patent application Ser. No. 12/774,064 entitled "Systems and Methods for Re-Designating Memory Regions as Error Code Corrected Memory Regions" and filed by Warren on a date even herewith; and in U.S. patent application Ser. No. 12/774,077 entitled "Systems and Methods for Implementing Error Correction in Relation to a Flash Memory" and filed by Warren on a date even herewith. Both of the aforementioned references are incorporated herein by reference for all purposes. Based upon the disclosure provided herein, one of ordinary skill in the art will recognize a variety of error code encoding processes or algorithms that may be used in relation to embodiments of the present invention.

Figure 8:
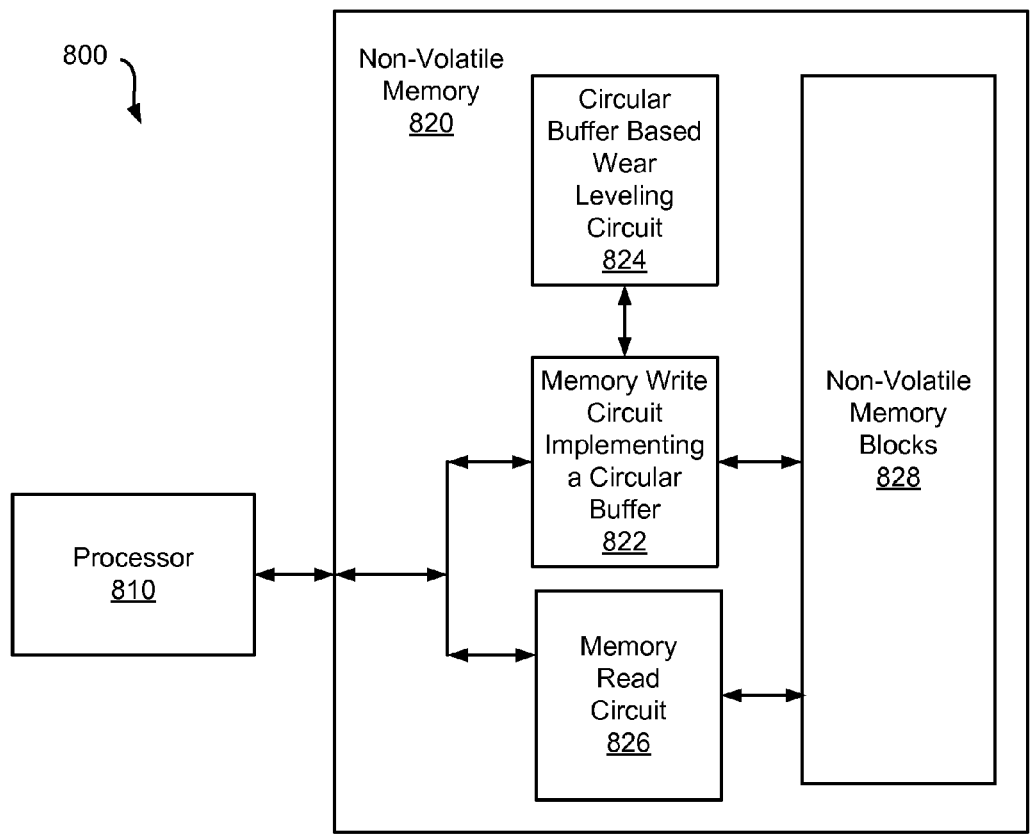
FIG. 8 depicts a computer system including a processor communicably coupled to a non-volatile memory implementing a circular buffering scheme in accordance with one or more embodiments of the present invention.

Turning to FIG. 8, a computer system 800 is shown that includes a processor 810 communicably coupled to a non-volatile memory 820 implementing a circular buffering scheme in accordance with one or more embodiments of the present invention. Processor 810 may be any host device, system or circuit operable to request information from non-volatile memory 820 and/or write data to non-volatile memory 820. Based upon the disclosure provided herein, one of ordinary skill in the art will recognize a variety of processors or hosts that may be used in relation to different embodiments of the present invention.

Non-volatile memory 820 may include a number of non-volatile memory blocks 828 that are accessible to processor 810 via a memory read circuit 826 and a memory write circuit 822. Memory write circuit 822 provides for writing regions of the non-volatile memory blocks 828 as a circular buffer. Non-volatile memory blocks 828 may be any group of memory cells capable of retaining its contents after a power down. As an example, non-volatile memory blocks 828 may be flash memory blocks. A circular buffer based wear leveling circuit 824 provides some level of wear leveling to non-volatile memory blocks 828. In one embodiment of the present invention, circular buffer based wear leveling circuit 824 indicates all of non-volatile memory blocks 828 as read only as soon as a predefined percentage of the blocks have been written one time. In other embodiments of the present invention, circular buffer based wear leveling circuit 824 indicates respective portions of non-volatile memory blocks 828 as read only once blocks within the portion have been written a predefined number of times as indicated by a write use count value corresponding to the respective portion. In yet other embodiments, circular buffer based wear leveling circuit 824 moves low use data to respective portions of non-volatile memory blocks 828 that have been written a predefined number of times as indicated by a write use count value corresponding to the respective portion, and identifies the respective portion as read only.

In conclusion, the invention provides novel systems, devices, methods and arrangements for memory usage. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A memory device, the device comprising:
   a plurality of non-volatile memory blocks; and
   a memory write circuit, wherein the memory write circuit is operable to write subsets of the plurality of non-volatile memory blocks at locations identified by a pointer, and wherein the memory write circuit is operable to update the pointer to implement a circular buffer in the plurality of non-volatile memory blocks.

2. The memory device of claim 1, wherein the non-volatile memory blocks are flash memory blocks.

3. The memory device of claim 2, wherein the memory write circuit is operable to determine an end of life of a respective subset of the plurality of non-volatile memory blocks, and wherein the memory write circuit is operable to identify a respective subset of the plurality of non-volatile memory blocks as read only based on an end of life determination.

4. The memory device of claim 3, wherein the respective subset of the plurality of non-volatile memory blocks includes less than all of the subsets of the plurality of non-volatile memory blocks.

5. The memory device of claim 1, wherein the memory write circuit is operable to identify the plurality of non-volatile memory blocks as read only after a defined percentage of the plurality of non-volatile memory blocks have been written.

6. The memory device of claim 1, wherein the memory device includes wear leveling control circuitry that is operable to level wear between subsets of the plurality of non-volatile memory blocks in the circular buffer.

7. The memory device of claim 6, wherein the wear leveling control circuitry includes a write use counter that is operable to indicate a number of writes that have occurred in relation to respective subsets of the plurality of non-volatile memory blocks.

8. The memory device of claim 7, wherein the wear leveling control circuitry is operable to write a data set stored in a first subset of the plurality of non-volatile memory blocks exhibiting a first write use count to a second subset of the plurality of non-volatile memory blocks exhibiting a second write use count.

9. The memory device of claim 8, wherein the second write use count corresponds to an end of life of a memory block within the second subset of the plurality of non-volatile memory blocks.

10. The memory device of claim 8, wherein the wear leveling control circuitry is further operable to identify the second subset of the plurality of non-volatile memory blocks as read only.

11. A method for wear leveling a memory device, the method comprising:
    providing a plurality of non-volatile memory blocks;
    writing series of subsets of the plurality of non-volatile memory blocks as a circular buffer;
    determining that a subsequent write will occur around the end of the circular buffer; and
    updating the circular buffer to invalidate respective subsets of the plurality of non-volatile memory blocks that include information that was superseded by writing the series of subsets.

12. The method of claim 11, wherein invalidating respective subsets of the plurality of non-volatile memory blocks includes erasing the respective subsets of the plurality of non-volatile memory blocks.

13. The method of claim 11, wherein the non-volatile memory blocks are flash memory blocks.

14. The method of claim 11, wherein the method further comprises:
    updating a write use count value associated with a respective subset of the plurality of non-volatile memory blocks when the respective subset of the plurality of non-volatile memory blocks is written.

15. The method of claim 14, wherein the respective subset of the plurality of non-volatile memory blocks is a first subset of the plurality of non-volatile memory blocks, wherein the write use count value is a first write use count value, and wherein the method further comprises:
    determining that the first write use count value indicates that the first subset of the plurality of non-volatile memory blocks is approaching an end of life;
    identifying a second subset of the plurality of non-volatile memory blocks and a corresponding second write use count value that is less than the first write use count value;
    moving a data set from the second subset of the plurality of non-volatile memory blocks to a subset of the first subset of the plurality of non-volatile memory blocks; and
    identifying the first subset of the plurality of non-volatile memory blocks as read only.

16. The method of claim 15, wherein the method further comprises:
   identifying the second subset of the plurality of non-volatile memory blocks as open for writing.

17. The method of claim 15, wherein the method further comprises:
   erasing the second subset of the plurality of non-volatile memory blocks.

18. The method of claim 11, wherein updating the circular buffer to invalidate respective subsets of the plurality of non-volatile memory blocks that include information that was superseded by writing the series of subset includes identifying all of the plurality of non-volatile memory blocks as read only.

19. A computer system, the computer system comprising:
   a processor; and
   a non-volatile memory, wherein the processor is communicably coupled to the non-volatile memory, and wherein the non-volatile memory includes:
      a plurality of non-volatile memory blocks; and
      a memory write circuit, wherein the memory write circuit is operable to write subsets of the plurality of non-volatile memory blocks at locations identified by a pointer, and wherein the memory write circuit is operable to update the pointer to implement a circular buffer in the plurality of non-volatile memory blocks.

20. The computer system of claim 19, wherein the non-volatile memory further comprises a circular buffer based wear leveling circuit, and wherein the circular buffer based wear leveling circuit is operable to perform a wear leveling algorithm selected from the group consisting of: indicating all of the plurality of non-volatile memory blocks as read only when a predefined percentage of the blocks have been written one time, indicating a respective portion of the plurality of non-volatile memory blocks as read only once at least one block within the respective portion has been written a predefined number of times as indicated by a write use count value corresponding to the respective portion, and moving low use data to a respective portion of the plurality of non-volatile memory blocks having at least one block within the respective portion that has been written a predefined number of times as indicated by a write use count value corresponding to the respective portion and identifying the respective portion as read only.

* * * * *